(12) United States Patent
Radosavljevic et al.

(10) Patent No.: US 11,670,637 B2
(45) Date of Patent: Jun. 6, 2023

(54) LOGIC CIRCUIT WITH INDIUM NITRIDE QUANTUM WELL

(71) Applicant: INTEL CORPORATION, Santa Clara, CA (US)

(72) Inventors: Marko Radosavljevic, Portland, OR (US); Sansaptak Dasgupta, Hillsboro, OR (US); Han Wui Then, Portland, OR (US); Paul B. Fischer, Portland, OR (US); Walid M. Hafez, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 960 days.

(21) Appl. No.: 16/279,102

(22) Filed: Feb. 19, 2019

(65) Prior Publication Data

US 2020/0266190 A1    Aug. 20, 2020

(51) Int. Cl.
*H01L 27/092* (2006.01)
*H01L 29/20* (2006.01)
(Continued)

(52) U.S. Cl.
CPC ...... *H01L 27/0922* (2013.01); *H01L 21/8252* (2013.01); *H01L 23/535* (2013.01);
(Continued)

(58) Field of Classification Search
None
See application file for complete search history.

(56) References Cited

U.S. PATENT DOCUMENTS

| 7,138,649 B2 * | 11/2006 | Currie | ............ | H01L 21/823412 |
| | | | | 257/190 |
| 9,123,569 B1 * | 9/2015 | Cheng | ............ | H01L 21/823878 |
| (Continued) | | | | |

FOREIGN PATENT DOCUMENTS

WO    WO-2017111770 A1 *    6/2017    ....... H01L 21/28088

OTHER PUBLICATIONS

John L. Lyons et al., "Shedding Lighten Doping of Gallium Nitride", SPIE, 2012, 3 pages.
(Continued)

*Primary Examiner* — Scott B Geyer
(74) *Attorney, Agent, or Firm* — Schwabe, Williamson & Wyatt P.C.

(57) ABSTRACT

An integrated circuit die has a layer of first semiconductor material comprising a Group III element and nitrogen and having a first bandgap. A first transistor structure on a first region of the die has: a quantum well (QW) structure that includes at least a portion of the first semiconductor material and a second semiconductor material having a second bandgap smaller than the first bandgap, a first source and a first drain in contact with the QW structure, and a gate structure in contact with the QW structure between the first source and the first drain. A second transistor structure on a second region of the die has a second source and a second drain in contact with a semiconductor body, and a second gate structure in contact with the semiconductor body between the second source and the second drain. The semiconductor body comprises a Group III element and nitrogen.

26 Claims, 8 Drawing Sheets

(51) Int. Cl.
    *H01L 27/06*   (2006.01)
    *H01L 29/15*   (2006.01)
    *H01L 29/778*  (2006.01)
    *H01L 21/8252* (2006.01)
    *H01L 23/66*   (2006.01)
    *H01L 23/535*  (2006.01)
    *H01L 29/66*   (2006.01)

(52) U.S. Cl.
    CPC .......... *H01L 23/66* (2013.01); *H01L 27/0605* (2013.01); *H01L 29/155* (2013.01); *H01L 29/2003* (2013.01); *H01L 29/66462* (2013.01); *H01L 29/7785* (2013.01); *H01L 29/7787* (2013.01)

(56) References Cited

U.S. PATENT DOCUMENTS

| | | | | |
|---|---|---|---|---|
| 2001/0045604 A1* | 11/2001 | Oda | ................... | H01L 27/0922 257/350 |
| 2004/0217375 A1* | 11/2004 | Yokogawa | ............ | H01L 29/872 257/E29.104 |
| 2009/0057651 A1* | 3/2009 | Edwards | ............ | H01L 27/0629 257/E29.069 |
| 2011/0042725 A1* | 2/2011 | Ohmi | ................... | H01L 29/045 257/487 |
| 2011/0261853 A1* | 10/2011 | Kajitani | ................ | H01S 5/3054 257/256 |
| 2014/0264380 A1* | 9/2014 | Kub | ................... | H01L 29/201 257/77 |
| 2014/0361378 A1* | 12/2014 | Lee | ................... | H01L 29/161 257/369 |
| 2015/0187770 A1* | 7/2015 | Mehrotra | ........ | H01L 21/823878 257/369 |
| 2015/0228670 A1* | 8/2015 | Caimi | ............... | H01L 21/02538 438/154 |
| 2015/0348969 A1* | 12/2015 | Edwards | ............... | H01L 21/266 438/307 |
| 2016/0163704 A1* | 6/2016 | Lee | ................... | H01L 29/7786 257/190 |
| 2016/0351564 A1* | 12/2016 | Azize | ................... | H01L 29/205 |
| 2017/0104012 A1* | 4/2017 | Cheng | ................ | H01L 27/1207 |
| 2017/0229460 A1* | 8/2017 | Czornomaz | ......... | H01L 29/1033 |
| 2018/0122701 A1* | 5/2018 | Li | ........................ | H01L 29/20 |
| 2018/0166339 A1* | 6/2018 | Hsueh | ................ | H01L 21/0254 |
| 2018/0323106 A1* | 11/2018 | Dasgupta | ............ | H01L 29/7781 |
| 2019/0363086 A1* | 11/2019 | Yang | ................... | H01L 29/775 |
| 2019/0371895 A1* | 12/2019 | Li | ........................ | H01L 29/785 |
| 2019/0393311 A1* | 12/2019 | Radosavljevic | .... | H01L 21/8252 |
| 2020/0105744 A1* | 4/2020 | Dasgupta | ............ | H01L 27/0629 |
| 2020/0105881 A1* | 4/2020 | Ramaswamy | ........ | H01L 29/882 |
| 2020/0119175 A1* | 4/2020 | Then | ................ | H01L 21/30625 |
| 2021/0028173 A1* | 1/2021 | Yang | ................ | H01L 29/78696 |

OTHER PUBLICATIONS

"Monolithic Microwave Integrated Circuit", Wikipedia, retrieved from URL: https://en.wikipedia.org/wiki/monolithic_microwave_integrated_circuit, retrieved on Jan. 28, 2019, 2 pages.

"Quantum Well", Wikipedia, retrieved from URL: https://en.wikipedia.org/wiki/Quantum_well, retrieved on Jan. 28, 2019, 4 pages.

* cited by examiner

US 11,670,637 B2

LOGIC CIRCUIT WITH INDIUM NITRIDE QUANTUM WELL

BACKGROUND

Semiconductor devices are electronic components that exploit the electronic properties of semiconductor materials, such as silicon (Si), germanium (Ge), gallium nitride (GaN), and indium phosphide (InP). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow between the source and drain. In instances where the charge carriers are electrons, the FET is referred to as an n-channel device, and in instances where the charge carriers are holes, the FET is referred to as a p-channel device. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) devices to implement logic gates and other digital circuits. A thin-film transistor (TFT) is one type of FET that can be fabricated on a substrate, for example, by depositing and patterning thin films of semiconductor material, dielectric material, and metal.

Figure 1:
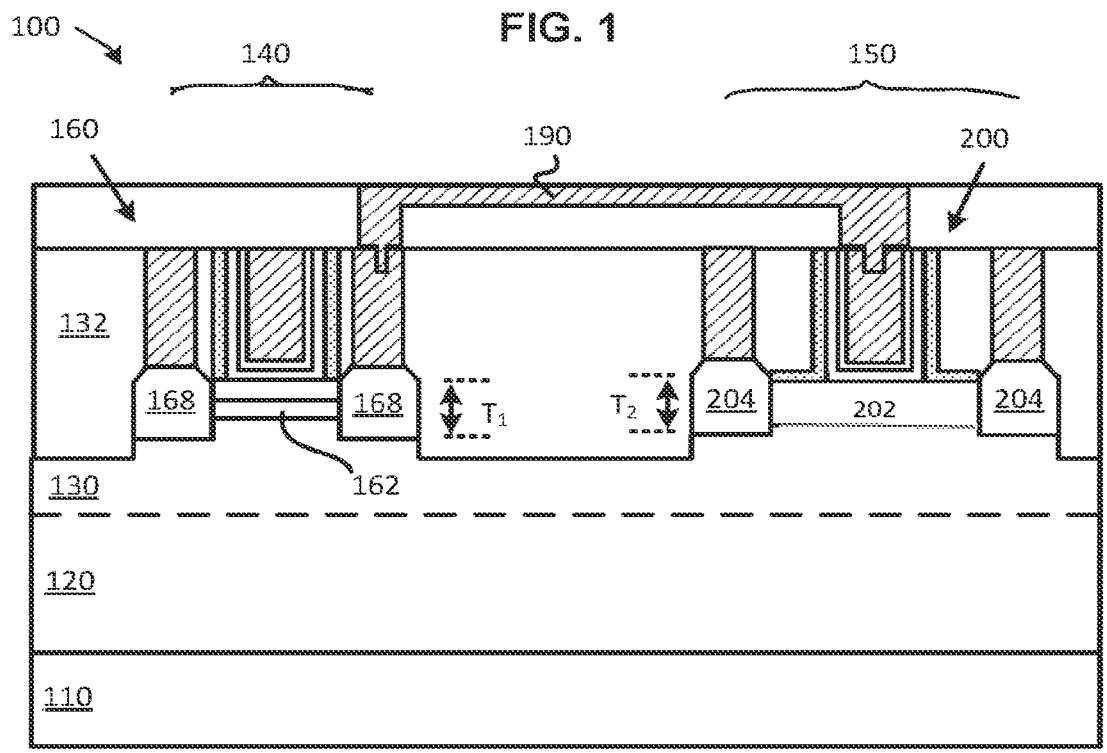
FIG. 1 illustrates a cross-sectional view of part of an integrated circuit die with a III-N base and including a first transistor with a quantum well channel region and a second transistor configured as a radio-frequency amplifier transistor, in accordance with an embodiment of the present disclosure.

These and other features of the present embodiments will be understood better by reading the following detailed description, taken together with the figures herein described. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Structures and methodologies are disclosed for an integrated circuit die that includes control logic and amplifier transistor devices on a common Group III-N base layer, in accordance with an embodiment of the present disclosure. In one embodiment, the die includes a first transistor with a quantum well channel including a Group III-nitride material (e.g., indium nitride or indium gallium nitride) and a second transistor with a gallium nitride channel region. The source or drain of the first transistor can be coupled to the gate of the second transistor in a complimentary logic circuit. In one example, the first transistor is a logic transistor and the second transistor is an RF transistor. In some such embodiments, the first transistor is a p-channel transistor and the second transistor is an n-channel transistor. For example, the drain of the p-channel transistor is electrically coupled to the gate of the n-channel transistor by an interconnect. In other embodiments, the type may be reversed, or both the first and second transistors may be the same type. In any such cases, the die can be configured for radio-frequency (RF) communications, in some embodiments, and include, for example, an RF amplifier, an RF filter, and/or a RF resonator.

The present disclosure also relates to methodologies for processing an integrated circuit die having both control logic transistors and amplifier transistors of Group III-nitride materials, for example. In accordance with one such embodiment, an AlGaN buffer is formed on a silicon substrate (e.g., graded $Al_xGa_{1-x}N$), followed by formation of a layer of gallium nitride on the AlGaN buffer. A first transistor having a channel with a III-nitride quantum well is formed on one region of the die, such as a control logic transistor. For example, the quantum well includes a relatively thin layer of InN or InGaN between layers of GaN. On a second region of the die, a transistor is formed having a channel of the gallium nitride or other Group III-nitride material, such as an RF power amplifier. The first transistor can be formed to be an n-channel or p-channel transistor while the second transistor can be formed to be an n-channel transistor, in accordance with an embodiment. In some embodiments, the drain of the control logic transistor can be coupled to the gate structure of the RF power transistor by interconnect. In such a case, the logic transistor can be used to turn on the RF transistor. Numerous embodiments and variations will be apparent in light of this disclosure.

General Overview

Available RF technologies have not integrated driver logic with RF circuits on a single integrated circuit die. One approach has been to co-integrate different functionalities via multi-chip arrangements and the use of multi-chip packaging solutions. Co-integrating different functionalities via multi-chip packaging, however, severely limits the utility of such approaches because it allows only a limited number of micro-scale connections between two chips. For example, complimentary logic circuits are formed on one chip that is coupled by external connectors to another chip containing RF devices. Such wires or other external connectors exhibit losses that degrade the overall performance of such multi-chip package solutions. Thus, a need exists for more intimate connections at the device level, rather than at the chip level. The present disclosure addresses this need.

In accordance with an embodiment of the present disclosure, an integrated circuit die includes a transistor with a quantum well channel region or structure in addition to a transistor configured for RF applications (e.g., amplification, filtering), both of which utilize Group III-nitride materials. In one example, the quantum well transistor has an indium nitride quantum well and the RF transistor has a channel of a Group III-nitride material, such as gallium nitride. In one example, the quantum well transistor and the RF transistor are formed on a common base of gallium nitride or other III-N material. The III-N base can be used as the active material of the RF transistor or as a substrate for another compositionally distinct III-N material. The III-N base material can also be used along with another Group III-nitride material of lower bandgap to define a quantum well.

Indium nitride (InN) has physical properties that closely resemble those of silicon, including a bandgap of ~0.7 eV and an electron/hole effective mass of ~0.055 $m_0$. In accordance with some embodiments of the present disclosure, RF transistors and control logic transistors advantageously can be manufactured in a monolithic approach with Group III-nitride materials. For example, radio frequency (RF) amplifier transistors and control logic transistors having a quantum well channel region can both be formed on a single die with a common starting substrate or base layer. For example, this base layer is gallium nitride. For example, an InN quantum well can be formed between GaN layers to define a quantum well channel for control logic transistors. GaN or a compositionally distinct III-N material grown on the GaN base layer can be used in the channel of the RF transistor. In some such embodiments, the control logic transistors have a channel with a smaller bandgap as well as a lower effective mass compared to GaN, providing improved performance.

In some embodiments, RF technology utilizes relatively thick layer of active material for n-type transistors compared to the active layer in the control logic transistor. For example, the quantum well may have a thickness less than 30 nm while the RF transistor has a channel material with a thickness of 100 nm, 200 nm, 500 nm, 1 μm or more. In one embodiment, the channel region of the control logic transistor has a quantum well structure that includes a layer of InN or InGaN having a high indium content. The thickness of this layer is not more than about 30 nm. This relatively thin active layer improves scalability in addition to controlling short-channel effects more effectively. As such, both performance and scalability are improved at the same time. Such transistor structures can be formed with a planar configuration or may alternately utilize a fin architecture (e.g., trigate configuration) or a nanowire or nanoribbon channel structure (i.e., a gate-all-around), in accordance with some embodiments. Numerous embodiments and variations will be apparent in light of the present disclosure.

Note that the expression "active material" or "active materials" as used herein simply refers to materials as variously noted herein, and is not intended to imply that the material is currently electrically biased or otherwise in a conductive state where carriers are mobile within the material, as will plainly be apparent and appreciated. For instance, a given active material need not be connected (whether directly or indirectly) to any power source whatsoever to be considered an active material. Nor does the active material need to be in a conducting state to be considered an active material.

Likewise, the use herein of expressions such as "channel region" or "channel structure" or "source region" or "source structure" or "drain region" or "drain structure" simply refers to specific locations of an overall transistor structure, and is not intended to imply that the transistor itself is currently electrically biased or otherwise in a conductive state where carriers are mobile within the channel region, as will be plainly apparent and appreciated. For instance, a given transistor need not be connected (whether directly or indirectly) to any power source whatsoever to have a channel region. Further note that the use of "source/drain" herein is simply intended to refer to a source region or a drain region or both a source region and a drain region. To this end, the forward slash ("/") as used herein means "and/or" unless otherwise specified, and is not intended to implicate any particular structural limitation or arrangement with respect to source and drain regions, or any other materials or features that are listed herein in conjunction with a forward slash.

Materials that are "compositionally different" or "compositionally distinct" as used herein refers to two materials that have different chemical compositions. This compositional difference may be, for instance, by virtue of an element that is in one material but not the other (e.g., SiGe is compositionally different from silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

As also used herein, the expression "X includes at least one of A or B" refers to an X that may include, for example, just A only, just B only, or both A and B. To this end, an X that includes at least one of A or B is not to be understood as an X that requires each of A and B, unless expressly stated. For instance, the expression "X includes A and B" refers to an X that expressly includes both A and B. Moreover, this is true for any number of items greater than two, where "at least one" item is included in X. For example, as used herein, the expression "X includes at least one of A, B, or C" refers to an X that may include just A only, just B only, just C only, only A and B (and not C), only A and C (and not B), only B and C (and not A), or each of A, B, and C. This is true even if any of A, B, or C happens to include multiple types or variations. To this end, an X that includes at least one of A, B, or C is not to be understood as an X that requires each of A, B, and C, unless expressly stated. For instance, the expression "X includes A, B, and C" refers to an X that expressly includes each of A, B, and C. Likewise, the expression "X included in at least one of A or B" refers to an X that may be included, for example, in just A only, in just B only, or in both A and B. The above discussion with respect to "X includes at least one of A or B" equally applies here, as will be appreciated.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate, for example, a die having a first transistor with a quantum well structure and a second transistor with a channel region of the material on the top and bottom of the quantum well structure. Such tools may indicate, for example, a first transistor with an indium nitride channel region and a second transistor with a gallium nitride channel region.

Architecture

FIG. 1 illustrates a cross-sectional (X-Z) view of part of an integrated circuit die 100, in accordance with an embodiment of the present disclosure. The die 100 includes a substrate 110 conducive to epitaxial growth of additional semiconductor materials thereon. In one embodiment, the substrate 110 is silicon, such as monocrystalline silicon with <111> crystal structure. The substrate 110 could also be sapphire, silicon carbide (SiC) or other materials, as will be appreciated. The substrate 110 can be a semiconductor wafer or other material providing structural support for integrated circuits. In some embodiments, a buffer 120 is on the substrate 110. A layer of Group III-nitride (III-N) semiconductor material 130 is on the buffer 120 or is grown as part of the buffer 120. In this example, the Group III-N semiconductor material 130 is gallium nitride (GaN) on a buffer 120 of $Al_xGa_{1-x}N$. GaN could also be epitaxially grown directly on a wafer of SiC or sapphire, in accordance with some embodiments.

The buffer 120 bridges the difference in lattice constant between the substrate 120 and the layer of III-N semiconductor material 130 so that high quality monocrystalline GaN can be grown. In one embodiment the buffer 120 comprises a layer of aluminum gallium nitride ($Al_xGa_{1-x}N$) with graded concentrations of aluminum and gallium. For example, at an interface with the substrate 110 of silicon, the buffer 120 has a ratio of Al:Ga of at least 80:20, such as 90:10 or 100:0. In some embodiments, the buffer 120 contains only trace amounts of gallium or no gallium at the interface with the substrate 110. As the thickness of the buffer 120 increases on the substrate 110, the concentration of aluminum atoms decreases while the concentration of gallium atoms increases. In one embodiment, the ratio of Al:Ga is 100:0 at the interface with the substrate 110 and transitions gradually or stepwise to 0:100 (GaN). In some embodiments, a layer of GaN (or other III-N semiconductor material) is a top portion of the buffer 120. For example, the GaN layer can be formed in a continuous deposition process with the buffer 120. In other embodiments, the GaN layer is material layer grown on top of the buffer 120 in a separate process, in accordance with some embodiments. In yet other embodiments, the buffer 120 comprises a plurality of layers of $Al_xGa_{1-x}N$ with a step-wise gradation of aluminum and gallium, as is discussed below in more detail with reference to FIG. 3. Note that a distinct boundary may not be visible or detectable between the layer of III-N semiconductor material 130 and the buffer 120, in accordance with some embodiments.

A first region 140 of the die 100 has a first transistor structure 160 and a second region 150 of the die has a second transistor structure 200. In one embodiment, the first region 140 is closely adjacent the second region 150, such as illustrated in FIG. 1. In other embodiments, the first region 140 can be spaced from the second region 150 so long as the first region 140 and second region 150 are located on the same die 100. An oxide, nitride, or other shallow trench isolation (STI) material 132 occupies space between the first and second transistor structures 160, 200, in accordance with some embodiments.

In the example of FIG. 1, the first transistor structure 160 has a smaller configuration compared to that of the second transistor structure 200, where the first transistor structure 160 is configured as a control logic transistor and the second transistor structure 200 is configured as a power amplifier. In one such embodiment, an interconnect 190 extends laterally between and electrically connects the drain of the first transistor structure 160 and the gate electrode 212 of the second transistor structure 200. As a general matter, an amplifier transistor requires a larger footprint and/or a thicker channel layer in order to accommodate the greater charge needed in such devices, as will be appreciated. In some such embodiments, the thickness $T_2$ of the channel region 202 of the second transistor structure 200 is at least 2 times, 5 times, 10 times, 20 times, 50 times, 100 times, or other amount greater than the thickness $T_1$ of the channel region or structure 162 of the first transistor structure 160.

In other embodiments, the first and second transistor structures 160, 200 can have the same or different size, where either or both transistors are configured as control logic transistors, amplifiers, or some other transistor configuration. In one embodiment, the first and second transistor structures 160, 200 are configured as a complementary metal oxide semiconductor (CMOS) circuit. For example, the first transistor structure 160 is configured as a p-channel (PMOS) transistor and the second transistor structure 200 is configured as an n-channel (NMOS) transistor. Numerous variations and embodiments will be apparent in light of the present disclosure.

Figure 2:
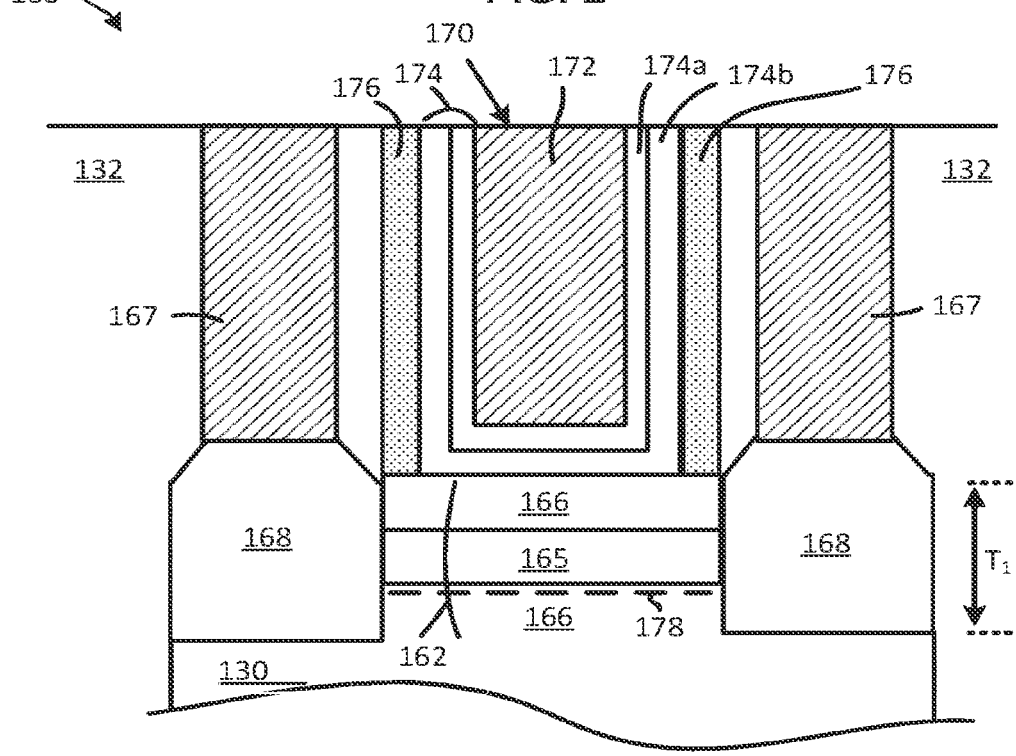
FIG. 2 illustrates a larger view of the first transistor structure shown in FIG. 1, in accordance with an embodiment of the present disclosure.

FIG. 2 shows a close-up view of the first transistor structure 160 of FIG. 1. The first transistor structure 160 has a body of active material or channel structure 162 extending between and in contact with a source and drain regions 168. Note that the term body as used herein may include one or more compositionally different layers. A gate structure 170 contacts the channel structure 162 between the source and drain regions 168. The gate structure 170 includes a gate electrode 172 and a gate dielectric 174, where the gate dielectric 174 is between the gate electrode 172 and the channel structure 162. The gate dielectric 174 can be a single layer or may be a multi-layer structure. For example, gate dielectric 174 includes a first oxide 174a on the gate electrode 172 and another dielectric material 174b (e.g., an oxide or nitride) on the first oxide 174a. The gate structure 170 may also include gate spacers 176 along its sides to isolate the gate structure 170 from the source and drain regions 168. Source and drain contacts 167 make electrical contact with the source and drain regions 168 and extend up through the shallow trench isolation (STI) material 132.

The channel structure 162 defines a quantum well (QW) that includes a material of smaller bandgap 165 between materials of larger bandgap 166, in accordance with one embodiment. For example, a relatively thin layer (~up to 30 nm) of InN is contained between the Group III-N semiconductor material (GaN) 130, and another layer of GaN is on top of the InN. In such an example, the InN has a bandgap of about 0.65 eV and the GaN has a bandgap of about 3.4 eV. As such, carriers (holes or electrons) in the InN are confined to discrete energy states. Similarly, the material of smaller bandgap 165 could be InGaN, which has a bandgap somewhere between 0.65 and 3.4 eV, depending on the relative concentrations of In and Ga. In one such embodiment, the material of smaller bandgap 165 is InGaN with a relatively high indium concentration (e.g., a ratio of In:Ga at least 50:50, at least 70:30, at least 80:20, or at least 90:10). In some embodiments, an oxide is on top of the material of smaller bandgap 165 instead of a III-N material, where the oxide adequately confines carrier movement in the material of smaller bandgap 165. For example, silicon dioxide ($SiO_2$) has a bandgap of about 8.7 eV, which is greater than the bandgap of the material of smaller bandgap 165. In some such embodiments, InN or InGaN is sandwiched between a layer of III-N material 130 below and a layer of silicon dioxide above. In some embodiments, the thickness $T_1$ of the channel structure 162 is no more than 100 nm, which includes the material of smaller bandgap 165 of not more than 30 nm.

In one example embodiment, the quantum well is defined by InN sandwiched between GaN on top and bottom. In one embodiment, the first transistor structure 160 has a planar transistor structure with the gate structure 170 on top of the channel structure 162. A fin-based architecture, nanowire, or nanoribbon configuration (e.g., a gate-all-around configuration) are also acceptable. In one nanowire configuration, for example, a nanowire of the material of smaller bandgap 165 (e.g., InN) is surrounded concentrically by material of larger bandgap (e.g., GaN). In another nanowire or nanoribbon configuration, the material of smaller bandgap 165 is bounded on top and bottom by the material of larger bandgap 166 and is bounded on the sides by an oxide. Numerous embodiments and variations will be apparent in light of the present disclosure.

The first transistor structure 160 can be configured as an n-channel device or as a p-channel device depending on the dopants used. For example, silicon, oxygen, and germanium can be used as n-type dopants; zinc, cadmium, magnesium, and beryllium can be used as p-type dopants. Undoped GaN can also be n-type depending on growth techniques, as will be appreciated. In some embodiments, dopants in the material of larger bandgap 166 can result in a two-dimensional electron gas (2DEG) 178 or two-dimensional hole gas (2DHG) 178 adjacent the interface with the material of smaller bandgap 165 (e.g., InN) and the material of larger bandgap 166 (e.g., GaN).

Figure 3:
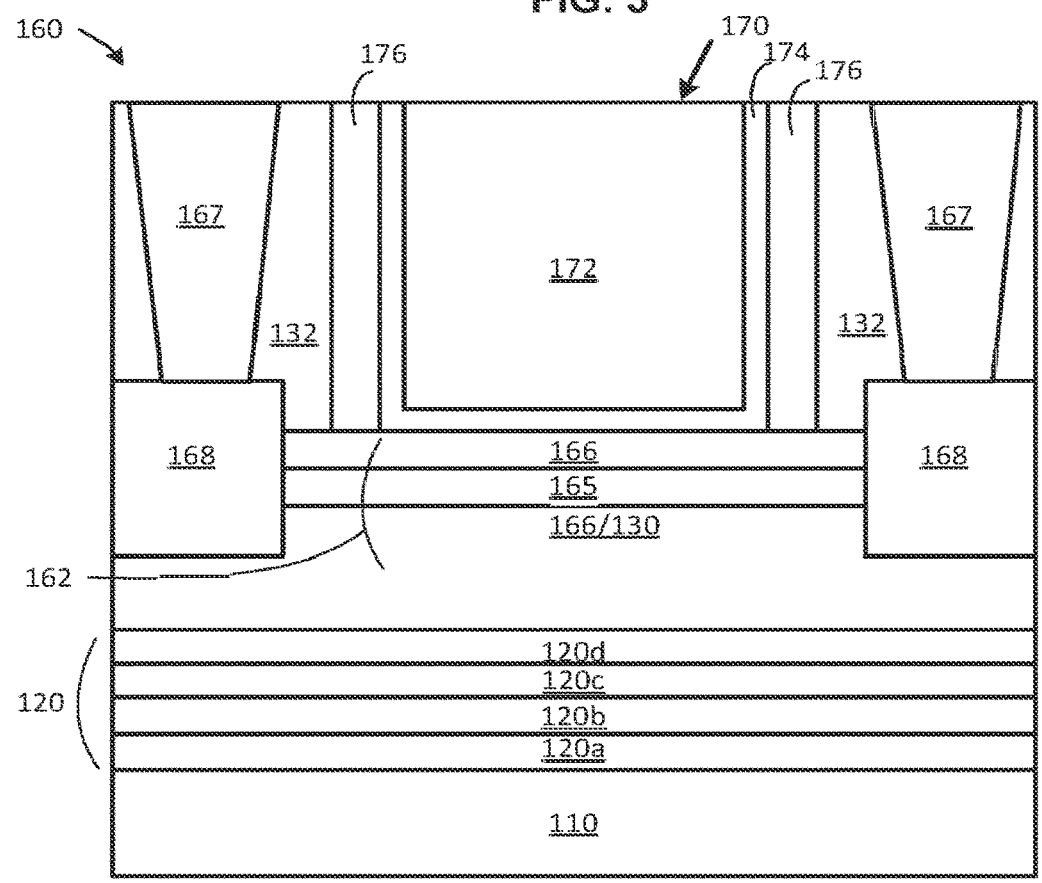
FIG. 3 illustrates a cross-sectional view of a quantum well transistor, in accordance with an embodiment of the present disclosure.

FIG. 3 shows a cross-sectional view of the first transistor structure 160 in accordance with another embodiment. In this example, the buffer 120 comprises a plurality of layers of $Al_xGa_{1-x}N$ with a step-wise gradation of aluminum and gallium. For example, a first buffer layer 120a is aluminum nitride (AlN), a second buffer layer 120b on the first buffer layer 120a has a relatively high Al content and low Ga content (e.g., $Al_{0.50}Ga_{0.20}N$), a third buffer layer 120c on the second buffer layer 120b has roughly equal portions Al and Ga (e.g., $Al_{0.50}Ga_{0.50}N$), and a fourth buffer layer 120d on the third buffer layer 120c has a relatively low Al content and relatively high Ga content (e.g., $Al_{0.20}Ga_{0.80}N$). A layer of GaN (e.g., a fifth layer) is on the fourth buffer layer 120d directly below it. Using buffer 120 as described herein, high-quality III-N semiconductor material 130 can be grown on the substrate 110, as will be appreciated. More or fewer layers of buffer material can be used as deemed appropriate to achieve the desired crystal quality of the III-N semiconductor material 130.

A quantum well channel structure 162 extends between source and drain regions 168 and includes a material of smaller bandgap 165 sandwiched between layers of material of larger bandgap 166. A gate structure 170 is on the channel structure 162 between the source and drain regions 168 and includes a gate dielectric 174 between the gate electrode 172 and the channel structure 162.

Figure 4:
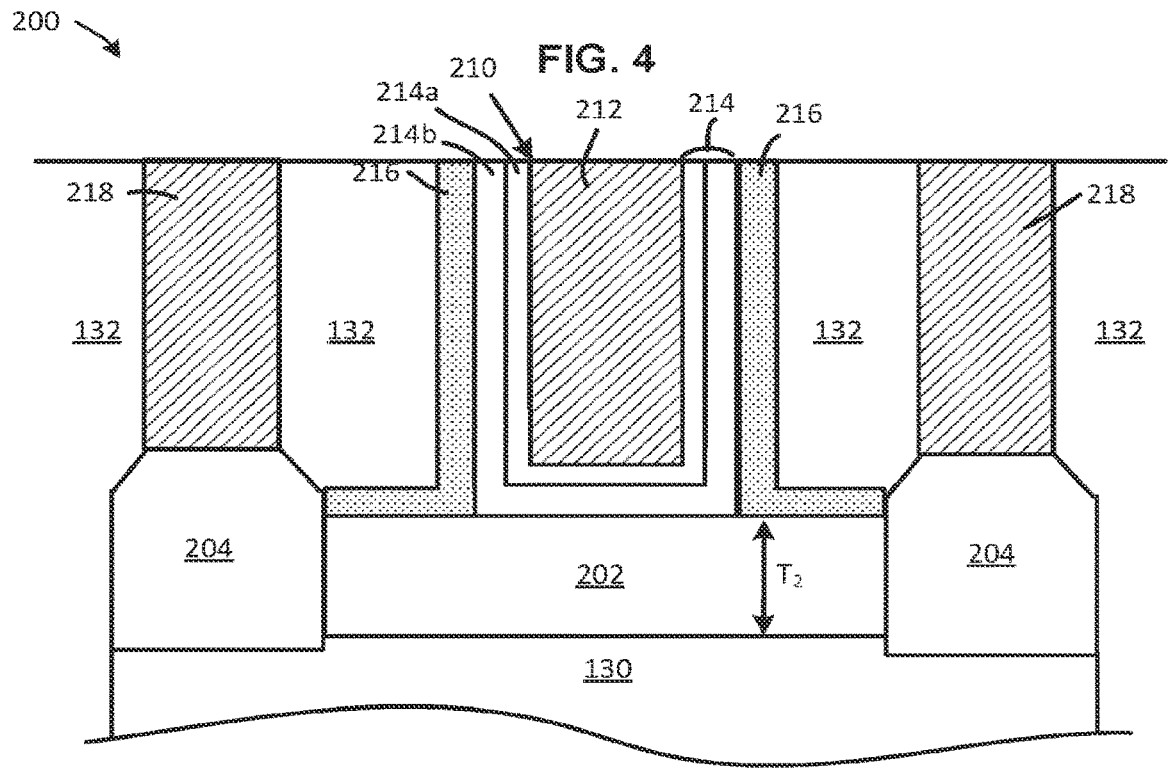
FIG. 4 illustrates a larger view of the second transistor structure shown in FIG. 2, in accordance with an embodiment of the present disclosure.

FIG. 4 shows a close-up view of the second transistor structure 200 of FIG. 1. The second transistor structure 200 has a body of active material or channel region 202 extending between and in contact with source and drain regions 204. A gate structure 210 contacts the channel region 202 between the source and drain regions 204. The gate structure 210 includes a gate electrode 212 and a gate dielectric 214, where the gate dielectric 214 is between the gate electrode 212 and the channel region 202. The gate dielectric 214 can be a single layer or may be a multi-layer structure. For example, the gate dielectric 214 includes a first dielectric material 214a (e.g., an oxide) on the gate electrode 212 and a second dielectric material 174b (e.g., an oxide or nitride) on the first dielectric material 214a. The gate structure 210 may also include gate spacers 216 (e.g., $Si_3N_4$) along its sides to isolate the gate structure 210 from the source and drain regions 204, for example. As shown in FIG. 3, for example, the gate spacers 216 can extend along the top surface or other part of the channel region 202. Source and drain contacts 218 make electrical contact with the source and drain regions 204 and extend up through the shallow trench isolation (STI) material 132, which occupies regions between the gate structure 210 and s/d contacts 218.

The second transistor structure 200 can be configured as an n-channel device, in accordance with some embodiments. In the example structure of FIG. 3, the second transistor structure 200 is configured as an n-channel RF amplifier with a III-N channel region 202. As such the thickness of the channel region 202 may be significantly thicker than that of the first transistor structure 160 configured, for example, as a control logic transistor. In one embodiment, the channel region 202 has a thickness T2 of at least 50 nm, at least 100 nm, at least 200 nm, at least 300 nm, at least 400 nm, at least 500 nm, at least 800 nm, or at least 1 µm. Note, however, that the second transistor structure 200 could also be configured as a p-channel device in accordance with some embodiments. In one embodiment, the channel region 202 comprises a III-N compound (e.g., AlInN) on the III-N semiconductor material 130 (e.g., GaN). In other embodiments, the channel region 202 comprises the III-N semiconductor material 130 (e.g., GaN). Other III-N compounds are acceptable for the channel region 202.

Although the gate structure 210 is shown in FIG. 3 as being on the top surface of the active material in the channel region 202, (e.g., a top gate configuration), the gate structure 210 in other embodiments may contact a bottom surface (e.g., a bottom gate configuration) or side surface of the channel region 202. Numerous variations and embodiments will be apparent in light of the present disclosure.

Figure 5:
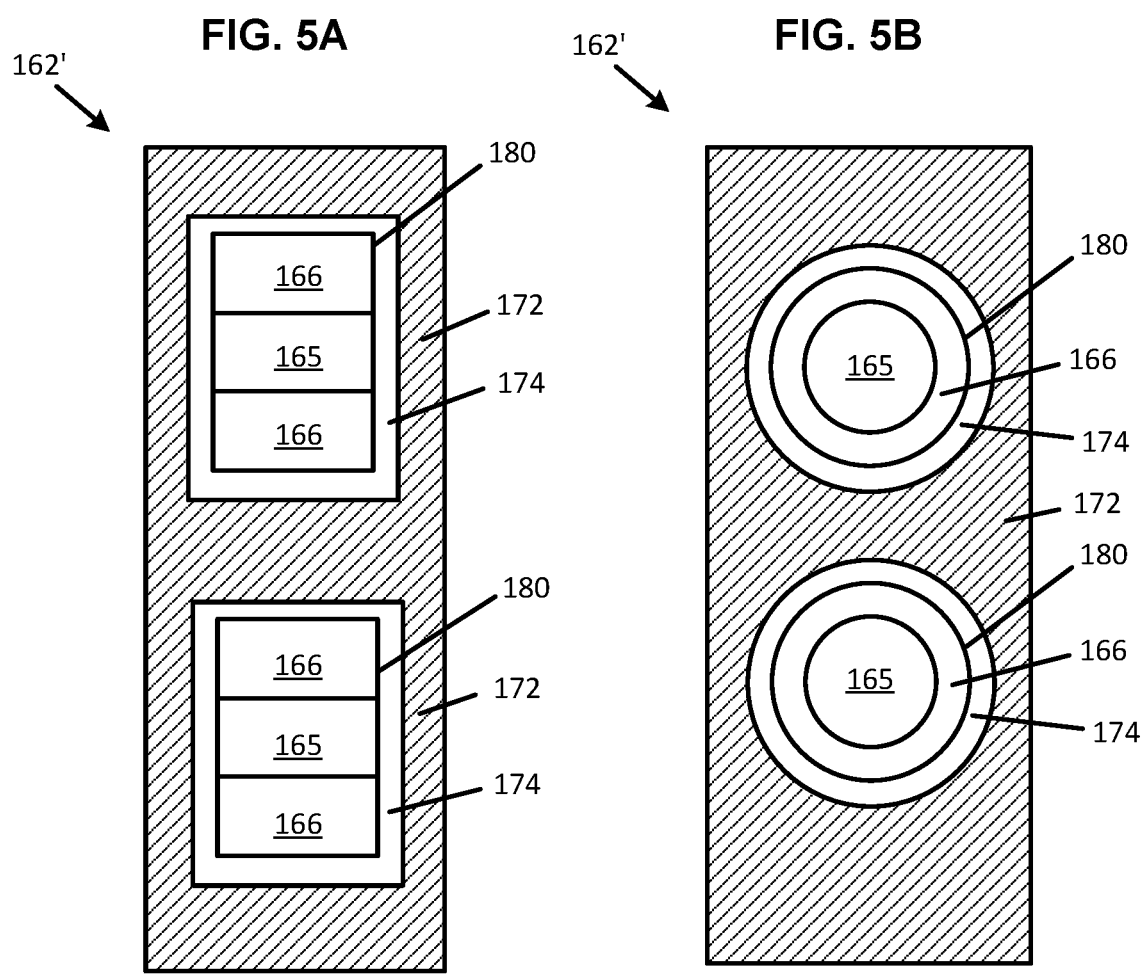
FIG. 5A-5B illustrate cross-sectional views of a channel region of a nanowire transistor, in accordance with some embodiments of the present disclosure.

FIGS. 5A and 5B illustrate cross-sectional views (e.g., Y-Z) taken through a quantum well channel structure 162' that includes a plurality of nanowires 180, in accordance with some embodiments. In FIG. 5A, each nanowire 180 defines a quantum well that includes a layer of a material of smaller bandgap 165 vertically between layers of a material of larger bandgap 166. The gate dielectric 174 surrounds each nanowire 180 and is between the nanowire 180 and the gate electrode 172. In this example embodiment, the material of smaller bandgap 165 is bounded on its sides by the gate dielectric 174. In FIG. 5B, each nanowire 180 has a generally circular cross-sectional shape. Each nanowire 180 defines a quantum well with a material of smaller bandgap 165 surrounded circumferentially by the material of larger bandgap 166. The gate dielectric is on the outside of each nanowire 180 between the nanowire 180 and the gate electrode 172. Although two nanowires 180 are shown in each example embodiment, more or fewer nanowires 180 can be used.

Fabrication Methodologies

Figure 6:
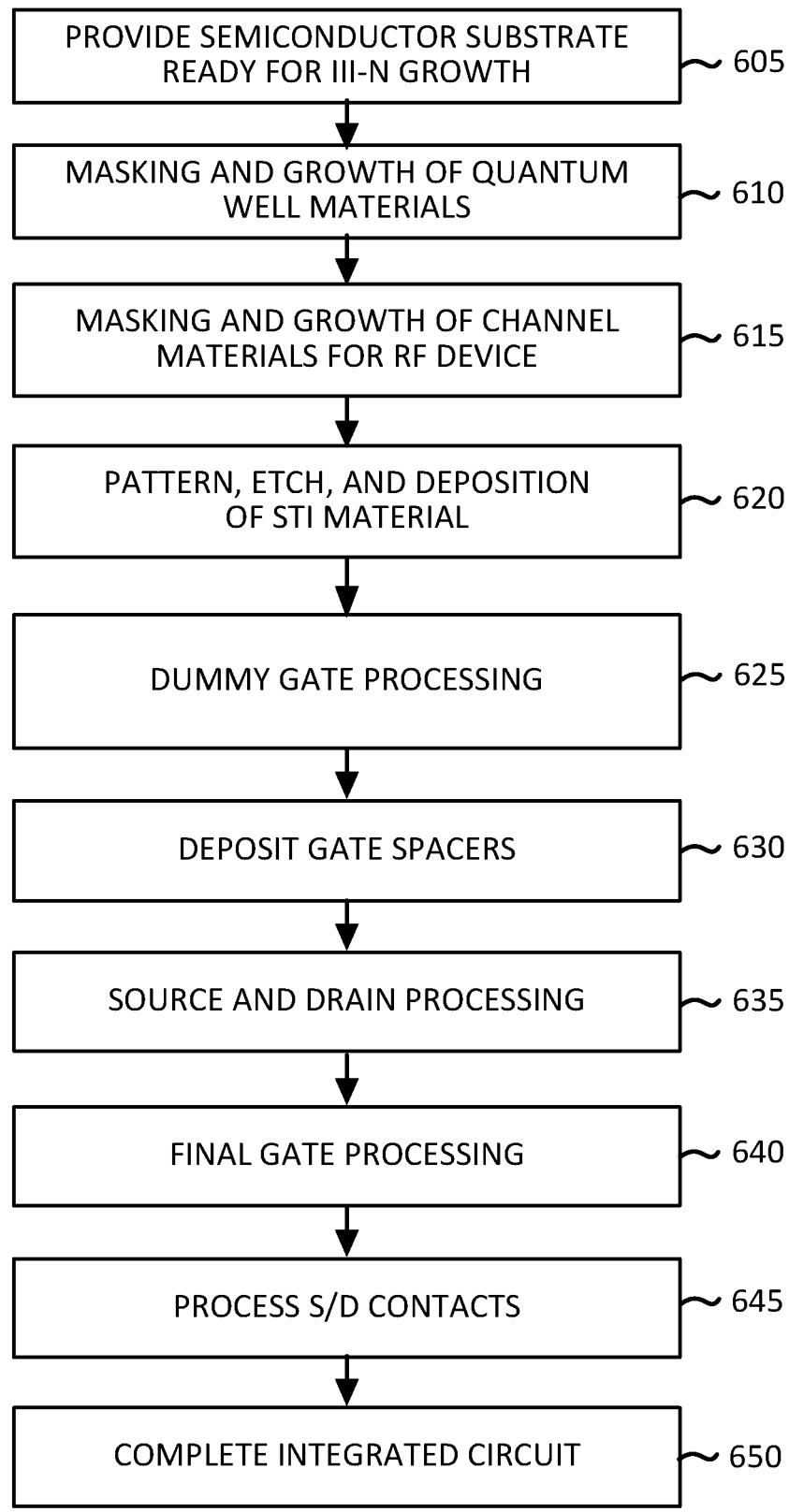
FIG. 6 illustrates a flow chart showing processes in a method of fabricating an integrated circuit, in accordance with an embodiment of the present disclosure.

Referring now to FIG. 6, a flow chart illustrates processes in a method 600 of fabricating an integrated circuit die, in accordance with some embodiments. To facilitate understanding of processes in method 600, FIGS. 7-15 will be discussed concurrently. FIGS. 7-15 illustrate cross-sectional views (X-Z) of example structures resulting from various processes in method 600. Method 600 is discussed below for fabrication of an integrated circuit die that includes both a quantum well transistor and a non-quantum well transistor on the same die 100 and utilizing Group III-N materials. For example, the quantum well transistor is a control logic transistor and the non-quantum well transistor is an RF amplifier transistor. Other combinations of transistors can be used, as will be appreciated.

In general, an integrated circuit die according to the present disclosure can be fabricated using any suitable semiconductor fabrication techniques, including deposition, photolithography, wet or dry chemical etching processes, chemical mechanical polishing, deposition or epitaxial growth processes (e.g., chemical vapor deposition (CVD), physical vapor deposition (PVD), atomic layer deposition (ALD), vapor phase epitaxy (VPE), molecular beam epitaxy (MBE), liquid phase epitaxy (LPE)), melt regrowth, and/or any other suitable processing, as will be appreciated.

In one embodiment, method 600 begins with providing 605 a substrate ready for III-N material growth. In one embodiment, the substrate is monocrystalline silicon with a <111> crystal lattice that includes a buffer suitable for epitaxial growth of a Group III-N material. As discussed above for some embodiments, the buffer can be a layer of aluminum gallium nitride ($Al_xGa_{1-x}N$) with graded concentrations of aluminum and gallium. In other embodiments, the buffer can include a plurality of layers of $Al_xGa_{1-x}N$ that provide a stepwise transition from AN to GaN, including a layer of AlN, a layer of $Al_xGa_{1-x}N$ with a relatively high aluminum content, a layer of $Al_xGa_{1-x}N$ with roughly an equal ratio of aluminum and gallium, a layer of $Al_xGa_{1-x}N$ having a relatively high gallium content, and finishing with a layer of GaN. The buffer is configured to bridge the difference in lattice constant between the substrate and the layer of III-N semiconductor material. Standard deposition techniques may be used to provide the various individual layers or graded layer in the buffer, such as low-pressure metal-organic vapor-phase epitaxy (MOVPE), molecular beam epitaxy (MBE), chemical vapor deposition (CVD), physical layer deposition (PLD), and atomic layer deposition (ALD). Likewise, standard layer transfer processes can be used to join structures formed separately on different substrates. In other embodiments, the substrate can include a wafer of AlN, sapphire, or other material suitable for epitaxial growth of III-N materials. In one embodiment, the substrate includes a sapphire or silicon carbide (SiC) substrate with epitaxial GaN thereon.

Figure 7:
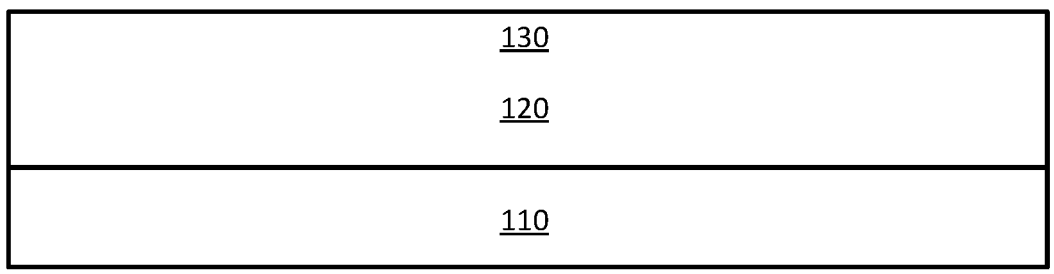
FIGS. 7-15 illustrate example structures corresponding to processes in the method of fabrication of FIG. 6, in accordance with some embodiments of the present disclosure.

FIG. 7 illustrates a cross-sectional view of part of a die 100 that includes a substrate 110 and a buffer 120 on the substrate 110. In this example, the buffer comprises $Al_xGa_{1-x}N$ on a silicon substrate 110. The buffer 120 includes a top layer of III-N semiconductor material 130, such as single crystal GaN. In some embodiments, the buffer 120 can be omitted, such as when the substrate 110 has a crystal structure suitable for epitaxial growth of monocrystalline III-N semiconductor material 130, as will be appreciated. Note that the relative vertical thicknesses of the various materials are not necessarily drawn to scale.

Method 600 continues with masking 610 the III-N semiconductor material 130 and epitaxial growth of quantum well materials. In one embodiment, process 610 includes blanket deposition of photoresist or other mask material, patterning, and liftoff to define one or more openings in the mask material at a first region of the substrate. Standard wet and/or dry processing may be used. Quantum well materials can be epitaxially grown on the III-N semiconductor material 130 where it is exposed through the mask opening. In one specific embodiment, a layer of indium nitride (InN) or aluminum indium nitride (AlInN) is epitaxially grown on the exposed gallium nitride (GaN). A layer of GaN or other material of larger bandgap is then grown on the material of smaller bandgap. In some embodiments, the quantum well material of smaller bandgap (e.g., InN) has a vertical thickness from 5 to 30 nm, including 5-10 nm, 5-15 nm, 5-20 nm, 5-25 nm, 10-15 nm, 10-20 nm, 10-25 nm, 15-20 nm, 15-25 nm, 15-30 nm, and 20-30 nm. Thicknesses below 5 nm can be used, but thicknesses of 5 nm or greater tend to show better uniformity for the quantum well, in accordance with some embodiments. A material of larger bandgap is grown or deposited on the material of smaller bandgap. In some embodiments, a layer of GaN is epitaxially grown on the layer of InN. In other embodiments, an oxide (e.g., $SiO_2$) is deposited on the layer of InN. Numerous variations and embodiments of the quantum well will be apparent in light of the present disclosure.

Optionally, the III-N semiconductor material is implanted with dopant prior to growth of the quantum well materials. In one embodiment where the III-N material is GaN, silicon, oxygen, and germanium can be used as n-type dopants; zinc, cadmium, magnesium, and beryllium can be used as p-type dopants. Undoped GaN can also be n-type depending on growth techniques, as will be appreciated. The dopant can be annealed as needed. Ion implantation or other suitable doping techniques can be used.

Figure 8:
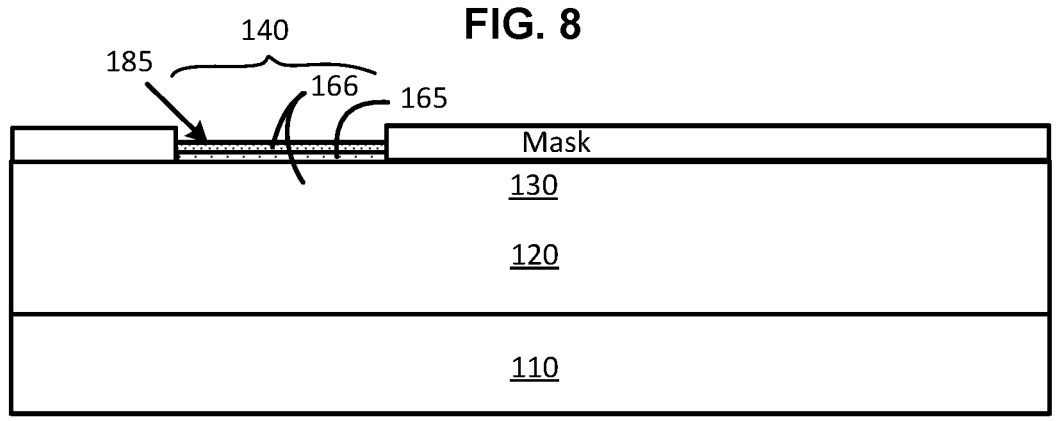

FIG. 8 illustrates a cross-sectional view showing a quantum well 185 formed in a mask opening. The quantum well 185 includes a layer of material of smaller bandgap 165 (e.g., InN) grown on the III-N semiconductor material 130 (e.g., GaN). A layer of material of larger bandgap 166 is on top of the material of smaller bandgap 165. In this example embodiment, a relatively thin layer of InN or AlInN is sandwiched between layers of GaN. Other Group III-N material combinations can be used, as will be appreciated.

Method 600 continues with masking 615 and epitaxial growth of a channel material for the RF device. In one embodiment, process 615 includes removal of the mask material used in process 610, blanket deposition of photoresist or other mask material (covering the quantum well structure), patterning, and liftoff to define one or more openings in the mask material at a second region of the substrate. Standard wet and/or dry processing may be used. A channel material for the RF device is then epitaxially grown on the exposed III-N material layer. In one embodiment, the channel material is aluminum indium gallium nitride (AlInGaN). The RF device channel material has a thickness of at least 5 nm and can be as thick as needed for charge carrying capacity and other device performance considerations.

Figure 9:
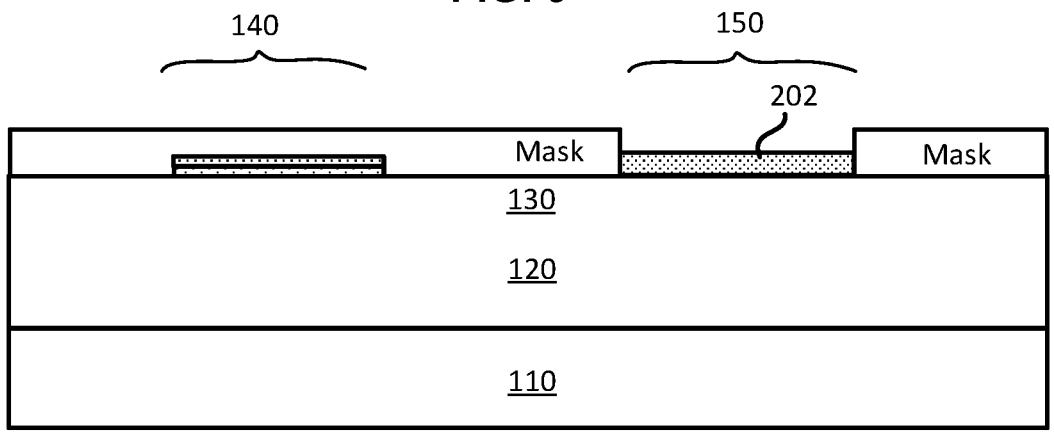

FIG. 9 illustrates a cross-sectional view showing the semiconductor structure of FIG. 7 after epitaxial growth of the RF device channel material 202 on a second region 150 of the III-N semiconductor material 130 base. In one embodiment, the RF channel material is AlInGaN. Other III-N materials can be used, including InGaN, GaN, InN, AlN, AlInN, and AlGaN.

Method 600 continues with deposition 620 of shallow trench isolation (STI) material. In one embodiment, process 620 includes removal of the mask used in process 615, followed by etching the structure surrounding the channel materials in the first and second regions. Process 620 can include recessing the STI material and planarizing/polishing the structure as needed (e.g., via chemical mechanical polishing) to expose the top surface of the channel region material in the devices. Deposition 620 of the STI material can be performed using any suitable deposition techniques, such as those described herein (e.g., CVD, ALD, PVD), or any other suitable deposition process. In some embodiments, the STI material may include any suitable electrical insulator material, such as one or more dielectric, oxide (e.g., silicon dioxide, aluminum oxide, carbon-doped silicon dioxide), and/or nitride (e.g., silicon nitride) materials. In some embodiments, the STI material may be selected based on the material of the substrate. For example, the STI material may be selected from silicon dioxide or silicon nitride based on the use of a Si substrate.

Figure 10:
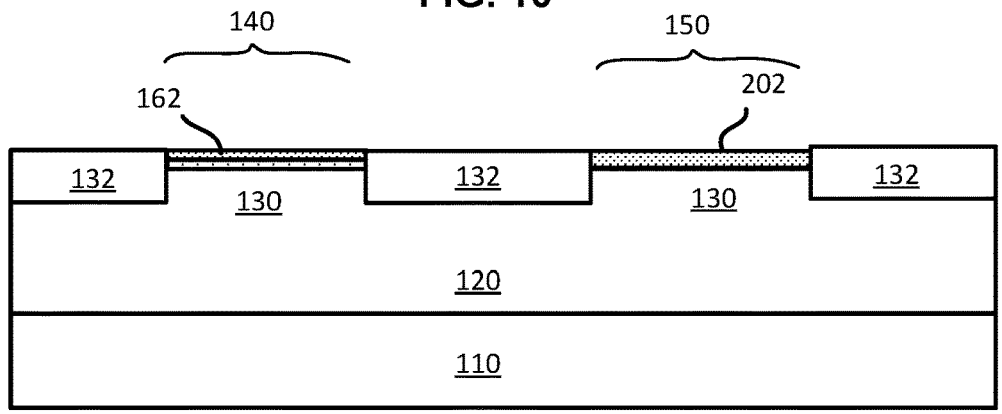

FIG. 10 illustrates a cross-sectional view of an example structure after process 620. STI material 132 has been deposited between the channel structures 162, 202 in the first region 140 and the second region 150, respectively. The top surface of each channel structure 162, 202 is coplanar with the STI material 132. The STI material 132 is recessed into the III-N semiconductor material 130.

Method 600 continues with depositing 625 a dummy gate structure on both devices. In one embodiment, the dummy gate is made with polysilicon. The dummy gate is deposited on channel structures 162, 202, such as on a middle portion of each channel structure 162, 202. In this example, depositing 625 the dummy gate structure is performed in accordance with a gate-last process flow. In some embodiments, the dummy gate electrode is made of polysilicon or other suitable material, as will be appreciated. A gate-last fabrication process may utilize a dummy gate structure to allow for replacement gate processing, while a gate-first fabrication process may form the final gate structure in the first instance; the final gate structure can be formed after the S/D regions have been processed. In other embodiments, the techniques may be performed using a gate-first process flow. In either a gate-last or a gate-first process flow, the end structure will include the final gate stack, as will be apparent in light of this disclosure. The dummy gate structure can define the channel region and source/drain (S/D) regions of each transistor structure, where the channel region is under the gate structure (whether dummy or final gate stack), and the source and drain regions are on either side of the gate structure and connect to the channel region.

Figure 11:
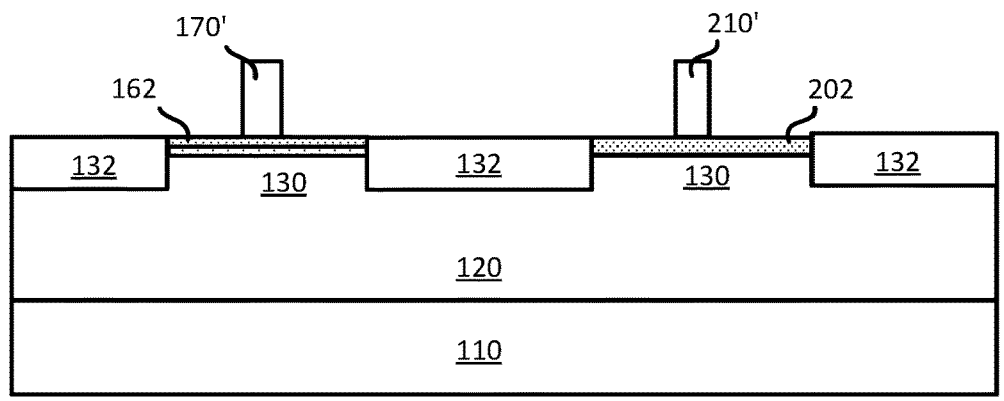

Depositing 625 the dummy gate can be performed using any suitable process. In one example, depositing 625 the dummy gate includes depositing a mask material on the die, patterning the mask to define vias corresponding to regions of the channel regions where the dummy gate material is to be deposited, depositing the dummy gate material, planarizing the structure as needed, and removing of the mask. In other embodiments, a blanket layer of dummy gate material (e.g., polysilicon) is deposited, followed by lithographic processing to remove regions of the dummy gate material where it is not desired. FIG. 11 illustrates a cross-sectional view of an example structure after depositing 625 the dummy gates 170' and 210'.

Method 600 continues with depositing 630 gate spacers on the dummy gates. In one embodiment, process 630 includes patterning the spacer material and etching the spacer material. For example, spacer material is removed from the on the control logic transistor structure to remove the spacer material from the top of the dummy gate and from the top surface of the channel region of the control logic transistor in the first region. The spacer material is removed from part of the top surface of the active material in the RF transistor in the second region. Spacer material is removed from the active material in locations where S/D processing will occur in subsequent processing, in accordance with some embodiments. Note that in some embodiments, a hardmask may be formed over the dummy gate structure to protect the dummy gate electrode and gate spacers during subsequent processing, for example. In some embodiments, the hardmask is formed on top of the dummy gate electrode between the gate spacers. An anisotropic etch or other suitable process can be used to remove regions of the spacer material.

Figure 12:
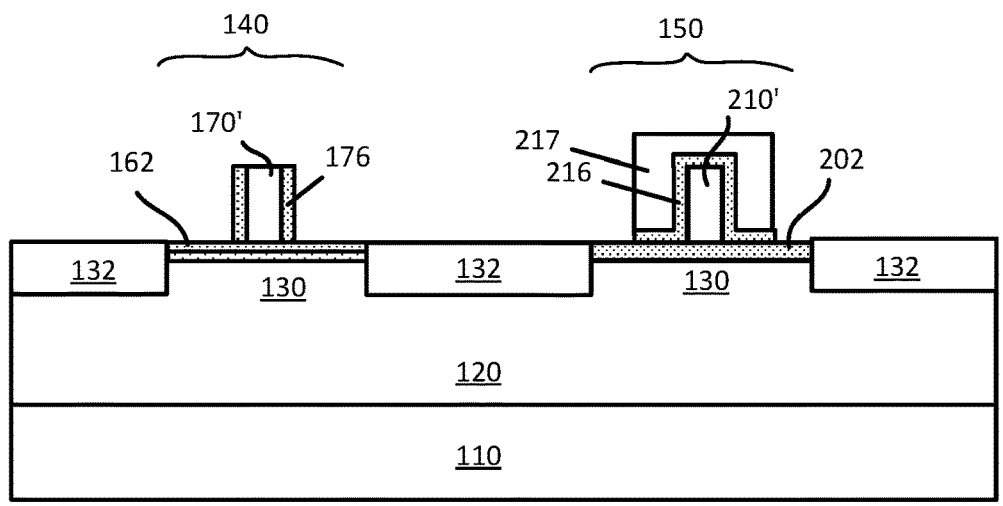

FIG. 12 illustrates a cross-sectional view of an example structure after depositing, patterning, and etching the gate spacers 176, 216. In the first region 140, the gate spacer 176 is on sides of the dummy gate 170' but has been removed from the top of the dummy gate 170' and from the top surface of the channel structure 162. In the second region 150, the gate spacer 216 is on part of the top surface of the channel region 202 and extends along the sides and top of the dummy gate 210'. A mask 217 on the gate spacer 216 in the second region 150 is used to define regions of the gate spacer 216 that are not removed during etch processing.

Method 600 continues with processing 635 the source and drain using any suitable techniques, in accordance with an embodiment of the present disclosure. In one embodiment, replacement S/D material is epitaxially grown using any suitable techniques, such as vapor-phase epitaxy (VPE), molecular beam epitaxy (MBE), or liquid-phase epitaxy (LPE). Material of the source and drain regions 120 can be epitaxially grown laterally from the channel material exposed at the gate spacer. For example, single-crystal material can be grown hemispherically outward from the exposed ends of the active channel material. Processing 635 the source and drain can include recessing at least a portion of the exposed active material in the first region and second region. For example, the active material in the first region includes the layers defining the quantum well and the active material in the second region includes the material of the channel region. In some embodiments, all of the active material left exposed from process 630 is removed by an anisotropic etch, in addition to some amount of the III-N semiconductor material below. In other embodiments, the etch process stops short of completely removing the active material at the source and drain regions, leaving behind a stub or residual portion of the active material. For example, part of the GaN material forming the quantum well may be left behind and/or part of the III-N material deposited for the channel region of the second region may be left behind. In some embodiments, the exposed active material in the source/drain regions is not removed or is not completely removed; instead, the active material at the source/drain regions is converted to final source/drain regions by doping, implantation, and/or cladding with a source/drain material or other suitable processing, for example. In one example, when the quantum well includes InN and GaN, the replacement S/D material is InGaN. III-N materials can be used for the replacement S/D material of the amplifier transistor in the second region.

In some embodiments, the source and drain may be formed one polarity at a time, such as processing one of n-type and p-type S/D, and then processing the other of the n-type and p-type S/D. In some embodiments, the source and drain may include any suitable doping scheme, such as including suitable n-type and/or p-type dopant (e.g., in a concentration in the range of 1E16 to 1E22 atoms per cubic cm). However, in some embodiments, at least one source or drain may be undoped/intrinsic or relatively minimally doped, such as including a dopant concentration of less than 1E16 atoms per cubic cm, for example.

In some embodiments, one or more of the S/D may have a multilayer structure including two or more distinct layers, for example. In some such embodiments, one or more of the layers of the S/D may include grading (e.g., increasing and/or decreasing) the content/concentration of one or more materials in some or all of the S/D. For instance, in some embodiments, it may be desired to gradually increase the concentration of a given dopant or element as a given S/D is formed, such as to reduce dopant diffusion. For example, the S/D has a relatively lower doping concentration near the channel region 130 and a relatively higher doping concentration near the corresponding S/D contact for improved contact resistance.

Figure 13:
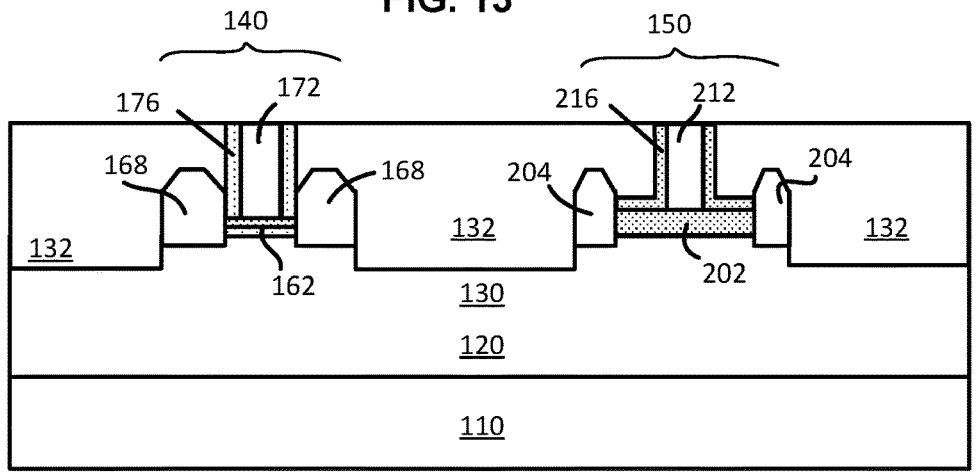

FIG. 13 illustrates a cross-sectional view of an example structure after processing 635 the source and drain regions 168, 204. As shown in this example, source and drain region 168, 204 are recessed into the III-N semiconductor material 130 and make contact with the active material in the respective channel region structure 162, 202. Gate spacers 176, 216 isolate the respective gate electrode 172, 212 from the S/D regions 168, 204.

Method 600 continues with processing 640 the final gate structure, which includes a gate dielectric and a gate electrode. In one embodiment, process 640 includes removing the dummy gate and cleaning as needed to prepare for the final gate structure. The gate dielectric can be a high-κ dielectric material such as hafnium dioxide ($HfO_2$), or other high-κ material, for example. In some embodiments, the gate dielectric is a multi-layer stack including, for example, a first layer of silicon dioxide ($SiO_2$) and a second layer of a high-κ dielectric such as $HfO_2$. Any number of gate dielectrics can be used, as will be appreciated in light of the present disclosure. In some embodiments, the gate dielectric has a thickness in a range from 2 nm to 10 nm, including 4-7 nm. The gate electrode may include a wide range of materials, such as polysilicon or various suitable metals or metal alloys, such as aluminum (Al), tungsten (W), titanium (Ti), tantalum (Ta), titanium nitride (TiN), or tantalum nitride (TaN), for example.

Figure 14:
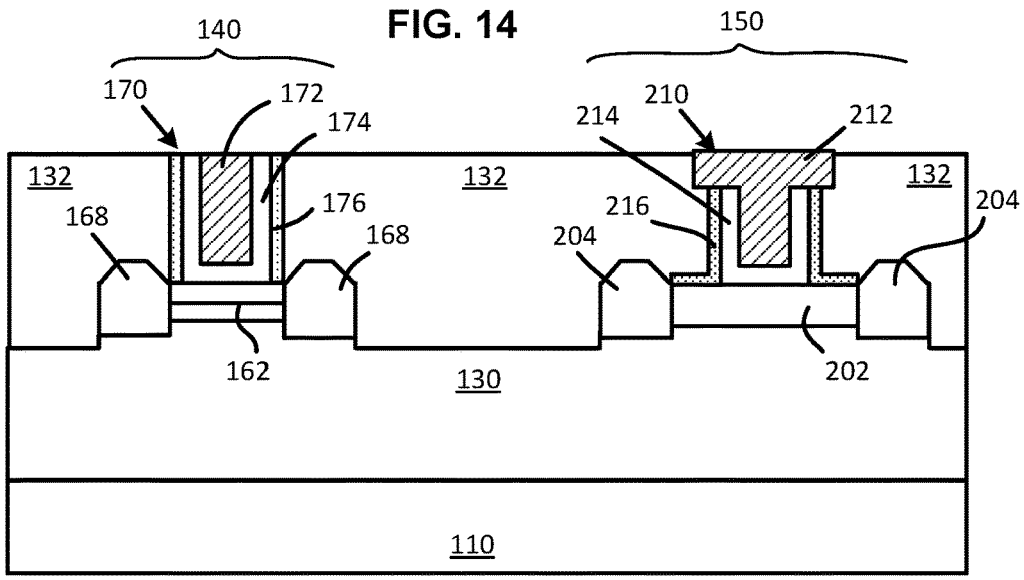

FIG. 14 illustrates a cross-sectional view of an example structure after processing 640 the final gate. In one embodiment, the gate electrode 212 of the transistor in the second region has a T-shape, where the vertical portion of the "T" is narrower in width than the size of the horizontal portion of the "T." In this example, each gate structure 170, 210 includes a gate electrode 172, 212 and gate dielectric 174, 214, respectively, where the gate dielectric is between the gate electrode and the active material of the channel structure 162, 202. Source and drain regions 168, 204 are spaced apart and make contact with the respective channel structure 162, 202 with the gate structure 170, 210 therebetween.

Method 600 continues with processing 645 the S/D contacts. The source and drain contacts can be formed using any suitable techniques, such as forming contact trenches in an ILD layer deposited over the respective source/drain regions, followed by depositing metal or metal alloy (or other suitable electrically conductive material) in the contact trenches. In some embodiments, processing 645 the S/D contacts may include silicidation, germanidation, III-V-idation, and/or annealing processes, for example. In some embodiments, the S/D contacts may include aluminum or tungsten, although any suitable conductive metal or alloy can be used, such as silver, nickel-platinum, or nickel-aluminum, for example. In some embodiments, one or more of the S/D contacts may include a resistance reducing metal and a contact plug metal, or just a contact plug, for instance. Example contact resistance reducing metals include, for instance, nickel, aluminum, titanium, gold, gold-germanium, nickel-platinum, nickel aluminum, and/or other such resistance reducing metals or alloys. Example contact plug metals include, for instance, aluminum, copper, nickel, platinum, titanium, or tungsten, or alloys thereof, although any suitably conductive contact metal or alloy may be used. In some embodiments, additional layers may be present in the source and drain contact regions, such as adhesion layers (e.g., titanium nitride) and/or liner or barrier layers (e.g., tantalum nitride), if so desired. In some embodiments, a contact resistance-reducing layer may be present between a given source or drain region and its corresponding source or drain contact 126, such as a relatively highly doped (e.g., with dopant concentrations greater than 1E18, 1E19, 1E20, 1E21, or 1E22 atoms per cubic cm) intervening semiconductor material layer, for example. In some such embodiments, the contact resistance reducing layer may include semiconductor material and/or impurity dopants based on the included material and/or dopant concentration of the corresponding source or drain region 120, for example. Optionally, the metallized structure is planarized to remove excess metal from the top of the ILD material, such as by chemical mechanical polishing (CMP).

Figure 15:
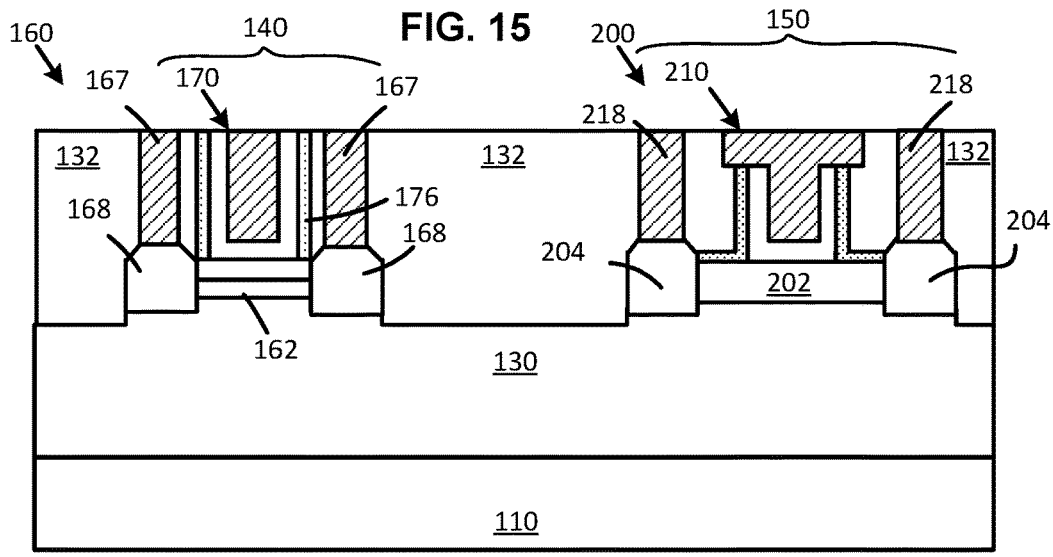

FIG. 15 illustrates a cross-sectional view of an example structure with first and second transistor structures 160, 200 after processing 645 the S/D contacts 167, 218, respectively. In the first region 140 of the die 100, S/D contacts 167 extend up from the source and drain 168 through the ILD material 132. The S/D contacts 167 are isolated electrically from the gate structure 170 by gate spacers 176 and ILD material 132. In the second region 150, S/D contacts 218 extend up from the source and drain 204 through the ILD material 132.

Method 600 continues by completing 650 an integrated circuit (IC) implementing the first and second transistor structures 160, 200. In one embodiment, the integrated circuit includes a drain of a control logic transistor electrically coupled to a gate electrode of an RF amplifier transistor. In another embodiment, the circuit includes a plurality of control logic transistors with at least one n-channel device and at least one p-channel device. Completing 255 the integrated circuit may include processing electrical connections to other components on the die, formation of metal interconnect, processing isolation structures, packaging, or other processing.

Although method 600 is discussed above as an example series of processes, it is to be understood that there is no required order to the processes unless specifically indicated. For example, processing the gate structure can occur before, concurrently with, or after processing for the S/D contacts. Method 600 has numerous variations as will be apparent.

Example System

Figure 16:
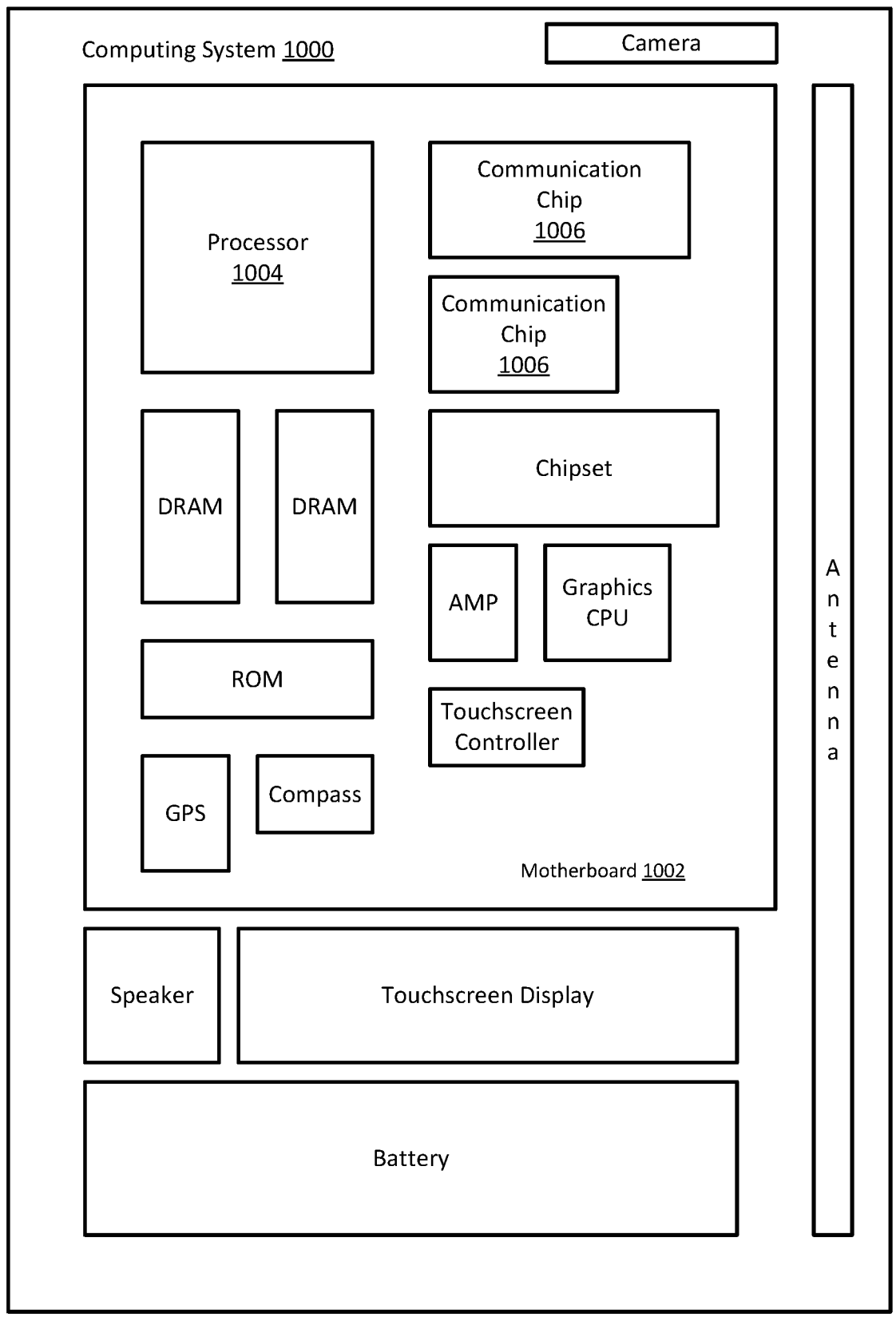
FIG. 16 illustrates an example computing system implementing an integrated circuit die as disclosed herein, in accordance with an embodiment of the present disclosure.

FIG. 16 illustrates a computing system 1000 implemented with the integrated circuit structures or techniques disclosed herein, according to an embodiment of the present disclosure. As can be seen, the computing system 1000 houses a motherboard 1002. The motherboard 1002 may include a number of components, including, but not limited to, a processor 1004 (including embedded memory, such as an eDRAM incorporating recessed thin-channel TFTs as described herein) and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, to name a few examples.

Depending on its applications, computing system 1000 may include one or more other components that may or may not be physically and electrically coupled to the motherboard 1002. These other components may include, but are not limited to, volatile memory (e.g., dynamic random access memory (DRAM) or embedded dynamic random access memory (eDRAM)), nonvolatile memory (e.g., read-only memory (ROM), resistive random-access memory (RRAM), and the like), a graphics processor, a digital signal processor, a crypto (or cryptographic) processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices (e.g., one or more memory cells, one or more memory cell arrays) formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, and the like that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices (e.g., one or more memory cells) formed using the disclosed techniques, as variously described herein. The term "processor" may refer to any device or portion of a device that processes, for instance, electronic data from registers and/or memory to transform that electronic data into other electronic data that may be stored in registers and/or memory. In some embodiments, RF amplifier transistors and control logic transistors are present together on a single die.

The communication chip 1006 also may include an integrated circuit die packaged within the communication chip 1006. In accordance with some such example embodiments, the integrated circuit die of the communication chip includes one or more integrated circuit structures or devices (e.g., one or more memory cells) formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices (e.g., one or more memory cells) formed using the disclosed techniques, as variously described herein.

Further Example Embodiments

The following examples pertain to further embodiments, from which numerous permutations and configurations will be apparent.

Example 1 is an integrated circuit die comprising: a layer of a first semiconductor material comprising a Group III element and nitrogen, the first semiconductor material having a first bandgap; a first transistor structure on a first region of the die, the first transistor structure having a quantum well structure that includes at least a portion of the first semiconductor material and a second semiconductor material having a second bandgap smaller than the first bandgap, a first source and a first drain in contact with the quantum well structure, and a first gate structure in contact with the quantum well structure between the first source and the first drain; and a second transistor structure on a second region of the die, the second transistor structure having a second source and a second drain in contact with a semiconductor body, and further having a second gate structure in contact with the semiconductor body between the second source and the second drain, the semiconductor body comprising a Group III element and nitrogen.

Example 2 includes the subject matter of Example 1, wherein the first gate structure includes a first gate electrode and a first gate dielectric, the first gate dielectric between the first gate electrode and the quantum well structure, and wherein the second gate structure includes a second gate electrode and a second gate dielectric, the second gate dielectric between the second gate electrode and the semiconductor body.

Example 3 includes the subject matter of Examples 1 or 2, wherein the first drain is electrically coupled to the second gate electrode.

Example 4 includes the subject matter of any of Examples 1-3, wherein the semiconductor body comprises another portion of the first semiconductor material.

Example 5 includes the subject matter of any of Examples 1-3, wherein the semiconductor body comprises nitrogen and the Group III element of the first semiconductor material.

Example 6 includes the subject matter of any of Examples 1-5, wherein the quantum well structure comprises a layer of the second semiconductor material on the layer of the first semiconductor material, the second semiconductor material having a second bandgap smaller than the first bandgap.

Example 7 includes the subject matter of Example 6, wherein the first bandgap is at least 3 eV and the second bandgap is no greater than 1.5 eV.

Example 8 includes the subject matter of Example 7, wherein the second bandgap is no greater than 1.0 eV.

Example 9 includes the subject matter of Example 6, wherein the quantum well structure further comprises an additional layer of the first semiconductor material on the layer of the second semiconductor material.

Example 10 includes the subject matter of Example 6, wherein the quantum well structure further comprises a dielectric on the layer of the second semiconductor material wherein the layer of the second semiconductor material is between the dielectric and the first semiconductor material.

Example 11 includes the subject matter of Example 10, wherein the dielectric is an oxide.

Example 12 includes the subject matter of any of Examples 1-11, wherein a thickness of the layer of the second semiconductor material is no greater than 30 nm.

Example 13 includes the subject matter of Example 12, wherein the thickness is from 5 to 20 nm.

Example 14 includes the subject matter of any of Examples 1-13, wherein the first semiconductor material comprises gallium and nitrogen and the second material comprises indium and nitrogen.

Example 15 includes the subject matter of any of Examples 1-14 and further comprises a substrate comprising silicon; and a buffer layer on the substrate, wherein the layer of the first semiconductor material is on the buffer layer.

Example 16 includes the subject matter of Example 15, wherein the buffer layer comprises aluminum, gallium, and nitrogen, wherein a concentration of aluminum is greater adjacent the substrate than adjacent the first semiconductor material and a concentration of gallium is greater adjacent the layer of the first semiconductor material than adjacent the substrate.

Example 17 includes the subject matter of Example 16, wherein the buffer layer has an atomic ratio of aluminum to gallium of at least 80:20 at an interface with the substrate, and the ratio being no greater than 20:80 at an interface with the first semiconductor material.

Example 18 includes the subject matter of any of Examples 15-17, wherein the buffer layer comprises n layers, wherein a first layer of then layers has an atomic ratio of aluminum to gallium of at least 90:10 and an nth layer of the n layers has the atomic ratio of aluminum to gallium of no more than 10:90.

Example 19 includes the subject matter of any of Examples 1-18, wherein the first transistor structure is configured as a control logic transistor.

Example 20 includes the subject matter of any of Examples 1-19, wherein the second transistor structure is configured as one of a radio frequency (RF) amplifier transistor, a RF resonator, and a RF filter.

Example 21 includes the subject matter of Example 19, wherein the second transistor structure is configured as a radio frequency (RF) amplifier transistor.

Example 22 includes the subject matter of any of Examples 1-21, wherein the second gate structure includes a gate electrode having a cross-sectional T shape.

Example 23 includes the subject matter of Example 22, wherein the first drain is electrically coupled to the second gate structure.

Example 24 includes the subject matter of any of Example 1-23, wherein the first transistor structure is a p-channel device and the second transistor structure is an n-channel device.

Example 25 includes the subject matter of any of Examples 1-24, wherein the first transistor structure and the second transistor structure are part of a complementary metal oxide semiconductor (CMOS) circuit.

Example 26 is an integrated circuit die comprising: a layer of a first semiconductor material comprising gallium and nitrogen; a first transistor structure on the layer, the first transistor structure including a first body comprising a Group III-nitride semiconductor material, a first source in contact with a first portion of the first body, a first drain in contact with a second portion of the first body spaced from the first portion, and a first gate structure in contact with the first body between the first source and the first drain, the first gate structure including a gate electrode and a gate dielectric wherein the gate dielectric is between the gate electrode and the first body; and a second transistor structure on the layer, the second transistor structure including a second body defining a quantum well structure, a second source and a second drain in contact with the second body wherein the second source is spaced from the second drain, and a second gate structure in contact with the second body between the second source and the second drain wherein the second gate structure includes a gate electrode and a gate dielectric and wherein the gate dielectric is between the gate electrode and the second body.

Example 27 includes the subject matter of Example 26, wherein the quantum well structure includes a first III-N material of a first bandgap, a second III-N material of a second bandgap, and a third material of a third bandgap, wherein the second III-N material is between the first III-N material and the third material and the second bandgap is smaller than the first bandgap and smaller than the third bandgap.

Example 28 includes the subject matter of Example 27, wherein the first III-N material and the third material each comprise gallium and nitrogen.

Example 29 includes the subject matter of Example 27, wherein the first III-N material comprises gallium and nitrogen.

Example 30 includes the subject matter of any of Examples 27-29, wherein the second III-N material comprises indium and nitrogen.

Example 31 includes the subject matter of any of Examples 26-30, wherein the second semiconductor material comprises indium and nitrogen.

Example 32 includes the subject matter of Example 31, wherein the second semiconductor material further comprises aluminum.

Example 33 includes the subject matter of any of Examples 27-32, wherein the third material is an additional layer of the first semiconductor material.

Example 34 includes the subject matter of any of Example 27, wherein the third material is an oxide.

Example 35 includes the subject matter of any of Examples 26-34, wherein the second body defines a two-dimensional electron gas.

Example 36 includes the subject matter of any of Examples 26-34, wherein the second body defines a two-dimensional hole gas.

Example 37 includes the subject matter of any of Examples 26-36, wherein the second body comprises multiple layers that are compositionally different from one another.

Example 38 includes the subject matter of any of Examples 26-37, wherein the first body is part of a radio frequency (RF) transistor structure and the second body is part of a control logic transistor structure.

Example 39 includes the subject matter of any of Examples 26-38, wherein the second drain is electrically coupled to the gate electrode of the first gate structure.

Example 40 includes the subject matter of Example 38, wherein the first transistor structure is configured as an amplifier transistor.

Example 41 includes the subject matter of Example 26-37, wherein the first transistor structure is configured as a radio frequency (RF) transistor.

Example 42 includes the subject matter of Example 26-41, wherein the gate electrode of the first gate structure has a cross-sectional T shape.

Example 43 includes the subject matter of Example 42, wherein the second drain is electrically coupled to the gate electrode of the first gate structure.

Example 44 includes the subject matter of any of Examples 26-43, wherein the first transistor structure is an n-channel device and the second transistor structure is a p-channel device.

Example 45 includes the subject matter of Example 26-44, wherein the first transistor structure and the second transistor structure are part of a complementary metal oxide semiconductor (CMOS) circuit.

Example 46 is an integrated circuit die comprising: a base of a first semiconductor material comprising gallium and nitrogen; a first transistor structure on a first portion the base, the first transistor structure including a first body comprising a Group III-nitride, a first source and a first drain in contact with the first body, wherein the first source is spaced from the first drain, and a first gate structure in contact with the first body between the first source and the first drain, the first gate structure including a first gate electrode and a first gate dielectric wherein the first gate dielectric is between the first gate electrode and the first body; and a second transistor structure on a second portion of the base, the second transistor structure including a second body defining a quantum well, a second source and a second drain in contact with the second body, wherein the second source is spaced from the second drain, and a second gate structure in contact with the second body between the second source and the second drain, the second gate structure including a second gate electrode and a second gate dielectric wherein the second gate dielectric is between the second gate electrode and the second body.

Example 47 includes the subject matter of Example 46 further comprising: a substrate comprising silicon; and a buffer layer on the substrate, the buffer layer comprising aluminum, gallium, and nitrogen, wherein the first semiconductor material is directly on the buffer.

Example 48 includes the subject matter of Example 46 or 47, wherein the quantum well includes the first semiconductor material having a first bandgap, a second III-N material of a second bandgap, and a third material of a third bandgap, wherein the second III-N material is between the first semiconductor material and the third material and the second bandgap is smaller than the first bandgap and smaller than the third bandgap.

Example 49 includes the subject matter of Example 48, wherein the third material is the same as the first semiconductor material.

Example 50 includes the subject matter of Example 48 or 49, wherein the second III-N material comprises indium and nitrogen.

Example 51 includes the subject matter of Example 50, wherein the second III-N material further comprises aluminum.

Example 52 includes the subject matter of Example 48, wherein the third material is an oxide.

Example 53 includes the subject matter of any of Examples 46-52, wherein the second body defines a two-dimensional electron gas or a two-dimensional hole gas.

Example 54 includes the subject matter of any of Examples 46-53, wherein the second drain is electrically coupled to the first gate electrode.

Example 55 includes the subject matter of any of Examples 46-54, wherein the first transistor structure is an n-channel device and the second transistor structure is a p-channel device.

Example 56 includes the subject matter of any of Examples 46-55, wherein the first transistor structure and the second transistor structure are part of a complementary metal oxide semiconductor (CMOS) circuit.

Example 57 is a method of fabricating an integrated circuit, the method comprising: providing a base comprising gallium and nitrogen; defining a quantum well on a first region of the base, the quantum well including a layer of group III-N material of a first bandgap, the layer between semiconductor materials having a bandgap larger than the first bandgap; defining a body of Group III-N semiconductor material on a second region of the base; forming a first source and first drain in contact with the quantum well, the first source spaced from the first drain; forming a second source and a second drain in contact with the body of Group III-N semiconductor material on the second region, the second source spaced from the second drain; depositing a first gate structure on the quantum well between the first source and the first drain, the first gate structure including a first gate electrode and a first gate dielectric, the first gate dielectric between the first gate electrode and the quantum well; and depositing a second gate structure on the body of Group III-N semiconductor material between the second source and the second drain, the second gate structure including a second gate electrode and a second gate dielectric wherein the second gate dielectric is between the second gate electrode and the body of Group III-N semiconductor material.

Example 58 includes the subject matter of Example 57, wherein the body of Group III-N semiconductor material comprises gallium and nitrogen.

Example 59 includes the subject matter of Example 57 or 58, wherein the layer of group III-N material of the first bandgap comprises indium and nitrogen.

Example 60 includes the subject matter of Example 58 wherein the body further comprises aluminum.

Example 61 includes the subject matter of Example 60, wherein the body further comprises indium.

Example 62 includes the subject matter of any of Examples 57-61, wherein the layer of group III-N material of the first bandgap has a thickness no greater than 30 nm.

Example 63 includes the subject matter of any of Examples 57-62, wherein providing the base includes providing a substrate comprising monocrystalline silicon and a buffer material comprising aluminum, gallium, and nitrogen, wherein the base is on the buffer material.

Example 64 includes the subject matter of any of Examples 57-63, wherein the layer of group III-N material of the first bandgap is between the base and an additional semiconductor material.

Example 65 includes the subject matter of Example 64, wherein the additional material comprises gallium and nitrogen.

Example 66 includes the subject matter of Example 64, wherein the additional material is an oxide.

Example 67 is a computing system comprising the integrated circuit die of any of claims 1-56.

Example 68 includes the subject matter of Example 67, wherein the computing system is configured for radio frequency communication.

Example 69 includes the subject matter of Example 67 or 68 further comprising a processor.

Example 70 includes the subject matter of Example 67-69 further comprising a memory structure.

Example 71 includes the subject matter of Example 67-70 further comprising a communication chip.

Example 72 includes the subject matter of Example 67-71 further comprising a touch screen controller.

Example 73 includes the subject matter of Example 67-72 further comprising dynamic random-access memory.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit die comprising:
   a layer of a first semiconductor material comprising a Group III element and nitrogen, the first semiconductor material having a first bandgap;
   a first transistor structure on a first region of the die, the first transistor structure having a quantum well structure that includes at least a portion of the first semiconductor material and a second semiconductor material having a second bandgap smaller than the first bandgap, a first source and a first drain in physical contact with the second semiconductor material of the quantum well structure, and a first gate structure in contact with the quantum well structure between the first source and the first drain; and
   a second transistor structure on a second region of the die, the second transistor structure having a second source and a second drain in contact with a semiconductor body, and further having a second gate structure in contact with the semiconductor body between the second source and the second drain, the semiconductor body comprising a Group III element and nitrogen.

2. The integrated circuit die of claim 1, wherein the first gate structure includes a first gate electrode and a first gate dielectric, the first gate dielectric between the first gate electrode and the quantum well structure, and wherein the second gate structure includes a second gate electrode and a second gate dielectric, the second gate dielectric between the second gate electrode and the semiconductor body.

3. The integrated circuit die of claim 1, wherein the semiconductor body comprises another portion of the first semiconductor material.

4. The integrated circuit die of claim 1, wherein the quantum well structure comprises a layer of the second semiconductor material on the layer of the first semiconductor material, the second semiconductor material having a second bandgap smaller than the first bandgap.

5. The integrated circuit die of claim 4, wherein the first bandgap is at least 3 eV and the second bandgap is no greater than 1.5 eV.

6. The integrated circuit die of claim 1, wherein the quantum well structure further comprises a dielectric on the layer of the first semiconductor material wherein the layer of the first semiconductor material is between the dielectric and the second semiconductor material.

7. The Integrated circuit die of claim 1, wherein a thickness of the layer of the second semiconductor material is no greater than 30 nm.

8. The integrated circuit die of claim 1, wherein the first semiconductor material comprises gallium and nitrogen and the second material comprises indium and nitrogen.

9. The integrated circuit die of claim 1 further comprising:
   a substrate comprising silicon; and a buffer layer on the substrate, wherein the layer of the first semiconductor material is on the buffer layer.

10. The integrated circuit die of claim 9, wherein the buffer layer comprises aluminum, gallium, and nitrogen, wherein a concentration of aluminum is greater adjacent the substrate than adjacent the layer of the first semiconductor material and a concentration of gallium is greater adjacent the layer of the first semiconductor material than adjacent the substrate.

11. The integrated circuit die of claim 1, wherein the first transistor structure is configured as a control logic transistor the second transistor structure is configured as one of a radio frequency (RF) amplifier transistor, a RF resonator, and a RF filter.

12. The integrated circuit die of claim 11, wherein the first drain is electrically coupled to the second gate structure.

13. An integrated circuit die comprising:
   a layer of a first semiconductor material comprising gallium and nitrogen;
   a first transistor structure on the layer, the first transistor structure including a first body comprising a Group III-nitride semiconductor material, a first source in contact with a first portion of the first body, a first drain in contact with a second portion of the first body spaced from the first portion, and a first gate structure in contact with the first body between the first source and the first drain, the first gate structure including a gate electrode and a gate dielectric wherein the gate dielectric is between the gate electrode and the first body; and
   a second transistor structure on the layer, the second transistor structure including a second body defining a quantum well structure, wherein the quantum well structure includes a first III-N material of a first bandgap and a second III-N material of a second bandgap, wherein the second bandgap is smaller than the first bandgap; a second source and a second drain in physical contact with the second III-N material of the second body, the second source spaced from the second drain; and a second gate structure in contact with the second body between the second source and the second drain, the second gate structure including a gate electrode and a gate dielectric wherein the gate dielectric is between the gate electrode and the second body.

14. The integrated circuit die of claim 13, wherein the quantum well structure includes the first III-N material of a first bandgap, the second III-N material of a second bandgap, and a third material of a third bandgap, wherein the second III-N material is between the first III-N material and the third material and the second bandgap is smaller than the first bandgap and smaller than the third bandgap.

15. The integrated circuit die of claim 14, wherein the first III-N material and the third material each comprise gallium and nitrogen.

16. The integrated circuit die of claim 15, wherein the second III-N material comprises indium and nitrogen.

17. The integrated circuit die of claim 16, wherein the second semiconductor material further comprises aluminum.

18. The integrated circuit die of claim 13, wherein the second body defines a two-dimensional electron gas or a two-dimensional hole gas.

19. The integrated circuit die of claim 13, wherein the first body is part of a radio frequency (RF) transistor structure and the second body is part of a control logic transistor structure.

20. The integrated circuit die of claim 19, wherein the second drain is electrically coupled to the gate electrode of the first gate structure.

21. An integrated circuit die comprising:
a layer of a first semiconductor material comprising a Group III element and nitrogen, the first semiconductor material having a first bandgap;
a first transistor structure on a first region of the die, the first transistor structure having a quantum well structure that includes at least a portion of the first semiconductor material and a second semiconductor material having a second bandgap smaller than the first bandgap, a first source and a first drain in contact with the quantum well structure, and a first gate structure in contact with the quantum well structure between the first source and the first drain, wherein the quantum well structure comprises a layer of the second semiconductor material on the layer of the first semiconductor material, the second semiconductor material having a second bandgap smaller than the first bandgap, and wherein the first bandgap is at least 3 eV and the second bandgap is no greater than 1.5 eV; and
a second transistor structure on a second region of the die, the second transistor structure having a second source and a second drain in contact with a semiconductor body, and further having a second gate structure in contact with the semiconductor body between the second source and the second drain, the semiconductor body comprising a Group III element and nitrogen.

22. An integrated circuit die comprising:
a layer of a first semiconductor material comprising a Group III element and nitrogen, the first semiconductor material having a first bandgap;
a first transistor structure on a first region of the die, the first transistor structure having a quantum well structure that includes at least a portion of the first semiconductor material and a second semiconductor material having a second bandgap smaller than the first bandgap, a first source and a first drain in contact with the quantum well structure, and a first gate structure in contact with the quantum well structure between the first source and the first drain, wherein the quantum well structure further comprises a dielectric on the layer of the first semiconductor material wherein the layer of the first semiconductor material is between the dielectric and the second semiconductor material; and
a second transistor structure on a second region of the die, the second transistor structure having a second source and a second drain in contact with a semiconductor body, and further having a second gate structure in contact with the semiconductor body between the second source and the second drain, the semiconductor body comprising a Group III element and nitrogen.

23. An integrated circuit die comprising:
a layer of a first semiconductor material comprising a Group III element and nitrogen, the first semiconductor material having a first bandgap;
a first transistor structure on a first region of the die, the first transistor structure having a quantum well structure that includes at least a portion of the first semiconductor material and a second semiconductor material having a second bandgap smaller than the first bandgap, a first source and a first drain in contact with the quantum well structure, and a first gate structure in contact with the quantum well structure between the first source and the first drain, wherein a thickness of the layer of the second semiconductor material is no greater than 30 nm; and
a second transistor structure on a second region of the die, the second transistor structure having a second source and a second drain in contact with a semiconductor body, and further having a second gate structure in contact with the semiconductor body between the second source and the second drain, the semiconductor body comprising a Group III element and nitrogen.

24. An integrated circuit die comprising:
a layer of a first semiconductor material comprising a Group III element and nitrogen, the first semiconductor material having a first bandgap;
a first transistor structure on a first region of the die, the first transistor structure having a quantum well structure that includes at least a portion of the first semiconductor material and a second semiconductor material having a second bandgap smaller than the first bandgap, a first source and a first drain in contact with the quantum well structure, and a first gate structure in contact with the quantum well structure between the first source and the first drain, wherein the first semiconductor material comprises gallium and nitrogen and the second material comprises indium and nitrogen; and
a second transistor structure on a second region of the die, the second transistor structure having a second source and a second drain in contact with a semiconductor body, and further having a second gate structure in contact with the semiconductor body between the second source and the second drain, the semiconductor body comprising a Group III element and nitrogen.

25. An integrated circuit die comprising:
a substrate comprising silicon;
a buffer layer on the substrate;
a layer of a first semiconductor material comprising a Group III element and nitrogen, the first semiconductor material having a first bandgap, wherein the layer of the first semiconductor material is on the buffer layer;
a first transistor structure on a first region of the die, the first transistor structure having a quantum well structure that includes at least a portion of the first semiconductor material and a second semiconductor material having a second bandgap smaller than the first bandgap, a first source and a first drain in contact with the quantum well structure, and a first gate structure in contact with the quantum well structure between the first source and the first drain; and a second transistor structure on a second region of the die, the second transistor structure having a second source and a second drain in contact with a semiconductor body, and further having a second gate structure in contact with the semiconductor body between the second source and the second drain, the semiconductor body comprising a Group III element and nitrogen.

26. An integrated circuit die comprising:

a layer of a first semiconductor material comprising a Group III element and nitrogen, the first semiconductor material having a first bandgap;

a first transistor structure on a first region of the die, the first transistor structure having a quantum well structure that includes at least a portion of the first semiconductor material and a second semiconductor material having a second bandgap smaller than the first bandgap, a first source and a first drain in contact with the quantum well structure, and a first gate structure in contact with the quantum well structure between the first source and the first drain; and a second transistor structure on a second region of the die, the second transistor structure having a second source and a second drain in contact with a semiconductor body, and further having a second gate structure in contact with the semiconductor body between the second source and the second drain, the semiconductor body comprising a Group III element and nitrogen, wherein the first drain is electrically coupled to the second gate structure.

* * * * *